United States Patent [19]

Briese

[11] Patent Number: 4,464,599

[45] Date of Patent: Aug. 7, 1984

[54] PIEZOELECTRIC RESONATOR WITH INTEGRATED CAPACITANCES

[75] Inventor: Wolfgang Briese, Berlin, Fed. Rep. of Germany

[73] Assignee: International Standard Electric Corporation, New York, N.Y.

[21] Appl. No.: 306,557

[22] Filed: Sep. 28, 1981

[30] Foreign Application Priority Data

Oct. 10, 1980 [DE] Fed. Rep. of Germany ....... 3038260

[51] Int. Cl.³ ............................................ H01L 41/04
[52] U.S. Cl. .................................. 310/348; 310/312; 310/318; 310/365; 331/158
[58] Field of Search ............... 310/317, 319, 348, 353, 310/366, 312, 318, 365

[56] References Cited

U.S. PATENT DOCUMENTS

| | | | |
|---|---|---|---|
| 3,488,530 | 1/1970 | Staudte | 310/348 |
| 3,527,967 | 9/1970 | Dyer et al. | 310/348 X |
| 4,013,982 | 3/1977 | Wood et al. | 310/321 X |
| 4,283,650 | 8/1981 | Koyama et al. | 310/348 X |
| 4,329,613 | 5/1982 | Kinzel et al. | 310/344 |

Primary Examiner—Siegfried H. Grimm
Assistant Examiner—W. R. Paxman
Attorney, Agent, or Firm—John T. O'Halloran; Peter R. Ruzek; Mary C. Werner

[57] ABSTRACT

If a piezoelectric crystal is used in circuits containing ICs with low supply voltage, the additional capacitors required in oscillator or filter circuits cannot be implemented as junction capacitances. To eliminate the need for additional discrete capacitors, these capacitances are implemented with additional films on the crystal.

11 Claims, 9 Drawing Figures

PIEZOELECTRIC RESONATOR WITH INTEGRATED CAPACITANCES

BACKGROUND OF THE INVENTION

The present invention relates to piezoelectric resonators with electrode films deposited on the crystal and with holding members holding the crystal at vibration nodes.

If such resonators are used in oscillator or filter circuits, small load, trimming or coupling capacitances are needed in most cases. As an example, FIG. 1 shows part of the oscillator circuit of a quartz-crystal watch module. 1 is a piezoelectric resonator, 2 is an amplifier, and $C_{L1}$ and $C_{L2}$ are load capacitors. The other divider stages present on an integrated-circuit chip used for such purposes, such as the IC 1115, are not shown. Because of the low supply voltage of such an integrated circuit, the load capacitors $C_{L1}$ and $C_{L2}$ can be realized therein as junction capacitances only with very great difficulty and with low Qs. Therefore, they had to be inserted into the circuit as discrete components. Similarly, filter circuits with piezoelectric resonators require capacitances which also had to be implemented with discrete components.

SUMMARY OF THE INVENTION

The present invention therefore has for its object to integrate these capacitances into the piezoelectric resonator, thereby eliminating the need for special components which would take up additional space. This object is attained by the means set forth in the claims.

BRIEF DESCRIPTION OF THE DRAWING

The invention will now be described by way of example with reference to the accompanying drawing, in which.

DESCRIPTION OF THE PREFERRED EMBODIMENT

Figure 1A:
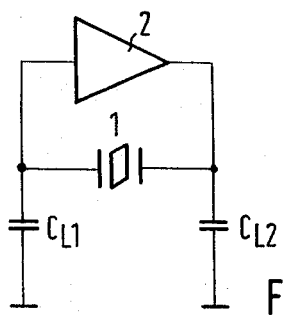
FIG. 1a shows the oscillator circuit diagram mentioned above.
Figure 1B:
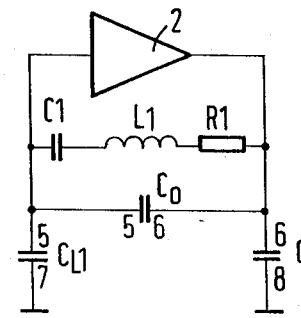
FIG. 1b shows the circuit diagram of FIG. 1a with the equivalent circuit of the resonator.
Figure 2A:
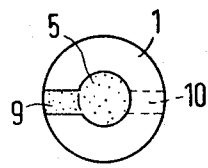
FIGS. 2a and 2b show a conventional circular resonator in top and sectional views.
Figure 2B:
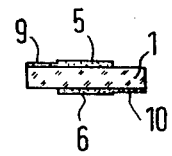

In FIG. 1b, the piezoelectric resonator 1 in the above-described circuit diagram of FIG. 1a has been replaced by its equivalent circuit. $C_1$, $L_1$, and $R_1$ are the equivalent values for the series resonance used, and $C_o$ is the unavoidable shunt capacitance given by the capacitance of the electrode films. If the electrode films are designated 5 and 6, it can be seen that the film 5 is connected to a plate of the load capacitor $C_{L1}$, while the film 6 is connected to a plate of the load capacitor $C_{L2}$. FIGS. 2a and 2b show a conventional circular resonator in top and cross-sectional views, respectively. The piezoelectric crystal is designated 1; 5 and 6 are the electrode films, and 9 and 10 are the pads of the electrode films.

Figure 3:
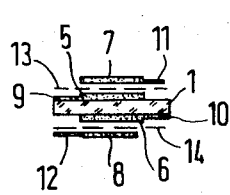
FIG. 3 shows a circular resonator according to the invention with additional insulating layers and films for two additional capacitances.

To accommodate capacitances on the piezoelectric plate in addition to the shunt capacitance $C_o$ provided by the electrode films, an electrode film 5 or 6 can be used as a plate for such a capacitance, while the necessary counter (corresponding opposite plate) film 7 or 8 is deposited on a dielectric insulating layer 13 or 14, as shown in FIG. 3. 9 and 10 are the pads f the electrode films 5 and 6, and 11 and 12 are the pads of the counter films 7 and 8. While the dielectric insulating layers 13, 14 and the counter films 7, 8 are really bonded to the electrode films 5, 6 and their pads 9, 10 on the piezoelectric crystal 1 with no space therebetween, spaces are shown in FIG. 3 to permit a graphical representation.

Figure 4:
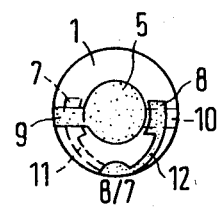
FIG. 4 shows a circular resonator according to the invention with additional counter films deposited for the pads.

FIG. 4 shows another possibility of implementing two capacitances each having one plate connected to one of the electrode films. One of the plates is formed by the pads of the electrode films, while the associated counter film is deposited opposite them on the other side of the crystal plate. 1 is again the crystal plate, 5 and 6 (invisible) are the electrode plates, 9 and 10 are their pads, 7 and 8 are the counter films, and 11 and 12 are the pads of the counter films.

Figure 5:
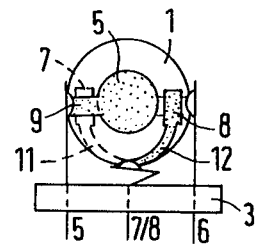
FIG. 5 shows the resonator of FIG. 4 in a holder.
Figure 6:
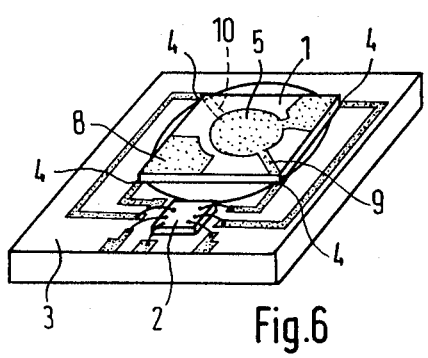
FIG. 6 shows a rectangular resonator according to the invention with additional integrated capacitances whose corners rest on the rim of a circular opening.
Figure 7:
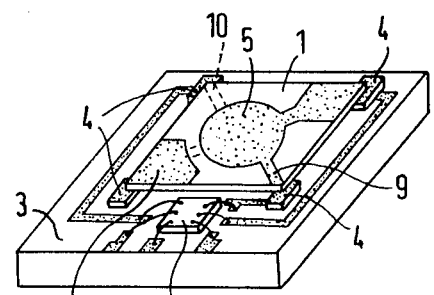
FIG. 7 shows a resonator as illustrated in FIG. 6 which is mounted by means of blocks attached at the four corners.

FIGS. 5 to 7 show holders for such piezoelectric resonators with integrated capacitances. In the arrangement of FIG. 5, the resonator shown in FIG. 4 is secured by means of three retaining springs mounted on a three-pole plug base 3. The reference numerals correspond to those of FIG. 4. In FIG. 6, the corners of a rectangular resonator 1 rest on the rim of a circular opening at the points 4, and its films 5, 6 and 7, 8 are connected, via pads 9, 10 or directly at these corners, to conductive strips on the substrate 3 by soldering or by means of a conductive adhesive. The resonator may also be supported by and attached to chamfered corners of the rectangular opening. The resonator shown in FIG. 7 has the same film structure and is connected to the conductive strips on the substrate 3 via blocks at the points 4 by soldering or by means of a conductive adhesive.

It is obvious that, as in the case of the resonator of FIG. 3, the capacitance counter films of the resonators shown in FIGS. 4 to 7 may also be deposited on a dielectric insulating layer applied to the pads 9 and 10. In the same manner, capacitances may be implemented which use neither of the two electrode films.

I claim:

1. A piezoelectric resonator arrangement comprising:
   a substrate having an opening;
   a resonator crystal;
   at least two electrode films positioned on said crystal;
   means for holding said crystal on said substrate and over said opening at the vibration nodes of said crystal;
   at least two capacitance films deposited on said crystal to provide circuit capacitance; and
   conductive means for providing electrical connection to said capacitance films via said holding means.

2. The piezoelectric resonator arrangement as claimed in claim 1 wherein one of each of said electrode films and capacitance films is positioned on one of the sides and the other of said electrode and capacitance films is positioned on the opposite side of the crystal such that each capacitance film is superimposed on the associated electrode film to form said circuit capacitance.

3. The piezoelectric resonator arrangement as claimed in claim 1 wherein one of said capacitance films is located on one side and the other capacitance film is located on the opposite side of said crystal and wherein said crystal constitutes a dielectric, said films and said crystal forming said circuit capacitance.

4. The piezoelectric resonator arrangement as claimed in claim 2, further comprising an insulating layer positioned between each of said capacitance films and said electrode films to form said circuit capacitance.

5. The piezoelectric resonator arrangement as claimed in claim 1 wherein the area of said capacitance films is varied to adjust said circuit capacitance.

6. The piezoelectric resonator arrangement is claimed in claim 1 wherein said opening is rectangular and has chamfered corners and said holding means is positioned on said chamfered corners.

7. The piezoelectric resonator arrangement as claimed in claim 1 wherein said holding means is a plurality of blocks.

8. The piezoelectric resonator arrangement as claimed in claim 1 wherein said opening is circular and said holding means is positioned on the rim of said circular opening.

9. The piezoelectric resonator arrangement as claimed in claim 1 wherein said holding means is a conductive adhesive.

10. An oscillator arrangement comprising:
a piezoelectric resonator arrangement including
  a substrate an opening
  a resonator crystal,
  at least two electrode films positioned on said crystal,
  means for holding said crystal on said substrate and over said opening at the vibration nodes of said crystal,
  at least two capacitance films deposited on said crystal to provide load capacitance, and
  conductive means for providing electrical connection to said capacitance films via said holding means.

11. A filter circuit arrangement comprising:
a piezoelectric resonator arrangement including
  a substrate an opening,
  a resonator crystal,
  a least two electrode films positioned on said crystal,
  means for holding said crystal on said substrate and over said opening at the vibration nodes of said crystal,
  at least two capacitance films deposited on said crystal to provide circuit capacitance, and
  conductive means for providing electrical connection to said capacitance films via said holding means.

* * * * *